US008994418B2

(12) United States Patent
Hoeppner et al.

(10) Patent No.: US 8,994,418 B2
(45) Date of Patent: Mar. 31, 2015

(54) METHOD AND ARRANGEMENT FOR GENERATING A CLOCK SIGNAL BY MEANS OF A PHASE LOCKED LOOP

(71) Applicant: Technische Universitaet Dresden, Dresden (DE)

(72) Inventors: Sebastian Hoeppner, Dresden (DE); Stefan Haenzsche, Dresden (DE)

(73) Assignee: Technische Universitaet Dresden, Dresden (DE)

( * ) Notice: Subject to any disclaimer, the term of this patent is extended or adjusted under 35 U.S.C. 154(b) by 0 days.

(21) Appl. No.: 14/189,410

(22) Filed: Feb. 25, 2014

(65) Prior Publication Data

US 2014/0240011 A1 Aug. 28, 2014

(30) Foreign Application Priority Data

Feb. 27, 2013 (DE) .......................... 10 2013 101 933

(51) Int. Cl.
*H03L 7/06* (2006.01)
*H03L 7/08* (2006.01)

(52) U.S. Cl.
CPC ...................................... *H03L 7/08* (2013.01)
USPC ............................ 327/150; 327/149; 327/159

(58) Field of Classification Search
CPC .............................. H03L 7/0814; H03L 7/091
USPC ................................................... 327/150, 159
See application file for complete search history.

(56) References Cited

U.S. PATENT DOCUMENTS

| 6,429,693 | B1 * | 8/2002 | Staszewski et al. ............. 327/12 |
| 6,943,600 | B2 | 9/2005 | Craninckx |
| 7,205,924 | B2 * | 4/2007 | Vemulapalli et al. ......... 341/166 |
| 7,990,191 | B2 * | 8/2011 | Fujino et al. ................... 327/156 |
| 8,155,256 | B2 * | 4/2012 | Staszewski et al. ............ 375/355 |
| 8,362,815 | B2 * | 1/2013 | Pavlovic et al. ............... 327/156 |
| 8,392,744 | B2 * | 3/2013 | Lin ............... 713/500 |
| 8,415,983 | B2 * | 4/2013 | Tokairin .......................... 327/12 |
| 8,433,025 | B2 * | 4/2013 | Sun et al. ...................... 375/376 |
| 8,471,736 | B1 * | 6/2013 | Booth et al. .................... 341/115 |
| 8,754,713 | B2 * | 6/2014 | Uozumi et al. ................ 331/1 A |
| 8,780,974 | B2 * | 7/2014 | Senoue et al. ............ 375/240.01 |
| 8,797,203 | B2 * | 8/2014 | Lee ................. 341/166 |
| 2011/0133795 | A1 | 6/2011 | Kim et al. |
| 2012/0049912 | A1 * | 3/2012 | Yoshida et al. ............... 327/156 |

OTHER PUBLICATIONS

Eisenreich, H., et al., A novel ADPLL design using successive approximination frequency control, Microelectronics Journal, vol. 40, Nov. 2009, pp. 1613-1622.
Wu, Chia-Tsun, et al., A Two-Cycle Lock-In Time ADPLL Design Based on a Frequency Estimation Alogorithm, IEEE Transactions on Circuits and Systems II: Express Briefs, vol. 57, No. 6, Jun. 2010, pp. 430-434.

* cited by examiner

*Primary Examiner* — Thomas J Hiltunen
(74) *Attorney, Agent, or Firm* — Heslin Rothenberg Farley & Mesiti P.C.

(57) ABSTRACT

A method and an arrangement for generating a clock signal by a phase locked loop in which the time for adjusting to a prescribed frequency and phase of a clock signal is reduced by virtue of the fact that a plurality of selection signals respectively shifted by a time difference delta t are generated from the divided clock signal. A comparison signal (capture) is generated under control by an edge of the reference clock and a comparison is started in the case of which what is selected is that selection signal shifted by delta t which exhibits with its edge the least possible time deviation from the edge of the comparison signal, and the selected selection signal is output.

4 Claims, 7 Drawing Sheets

Figure 3:
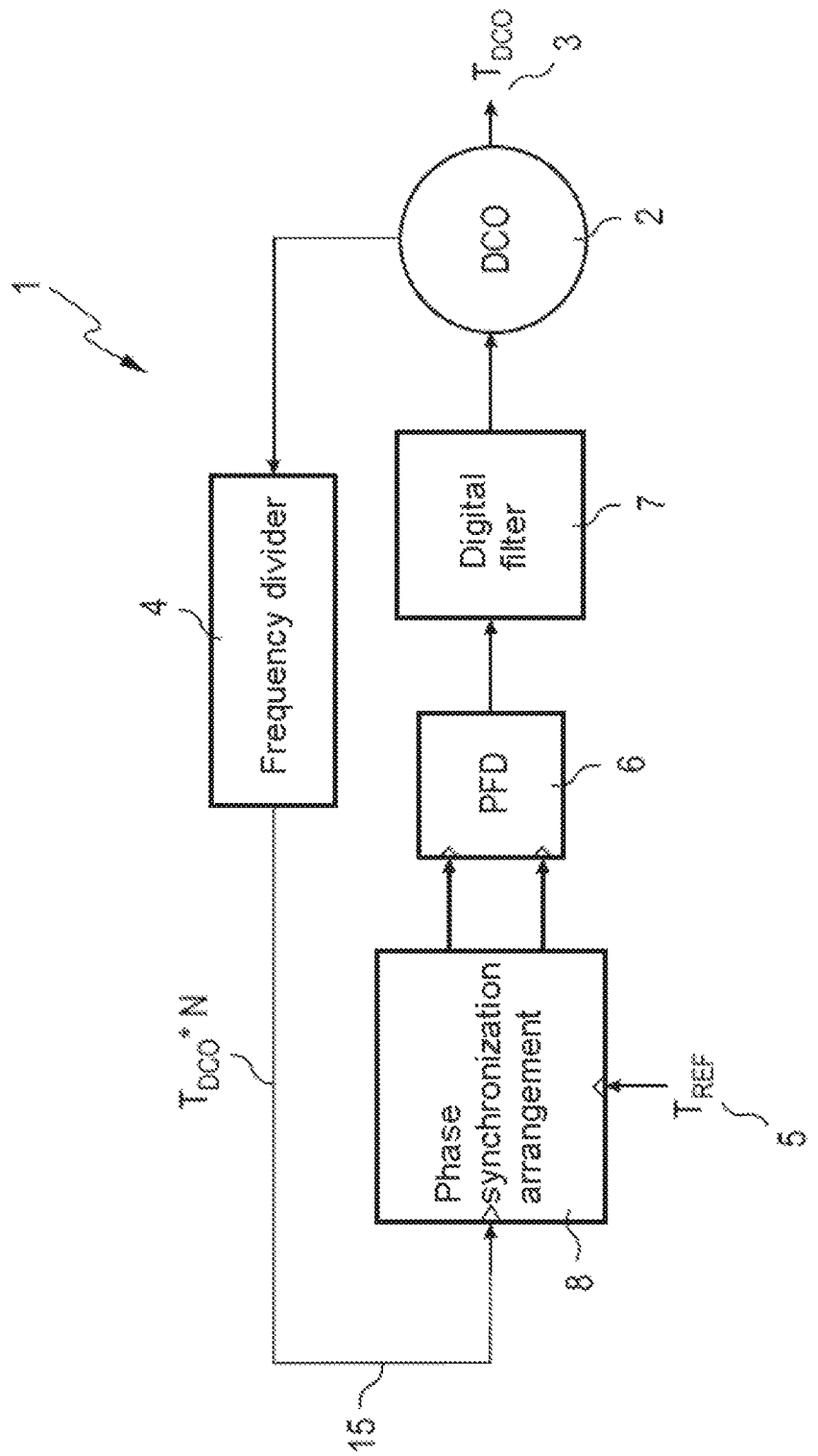

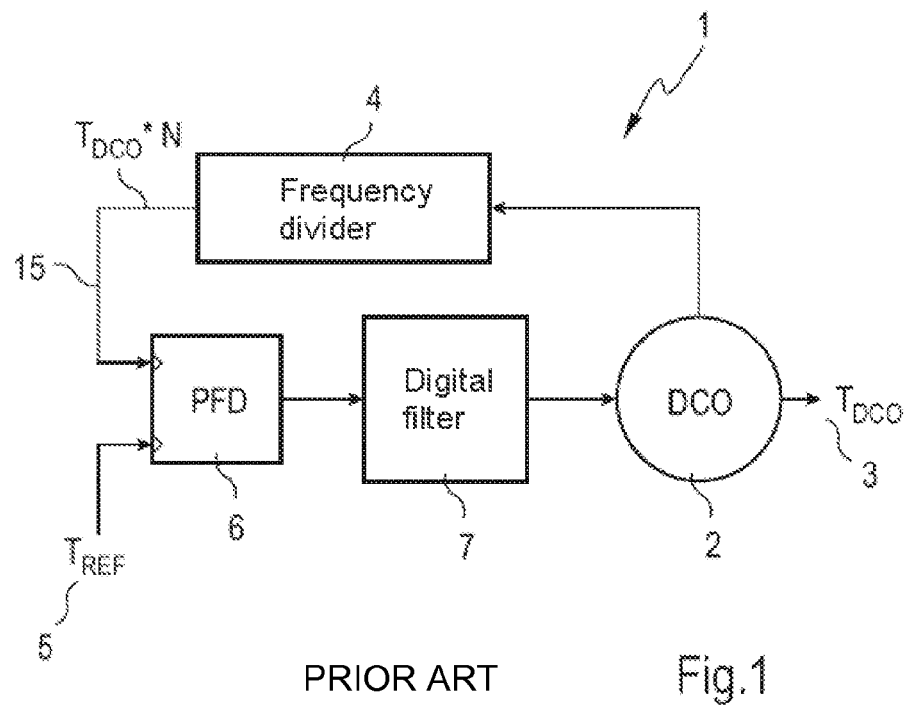
PRIOR ART   Fig. 1
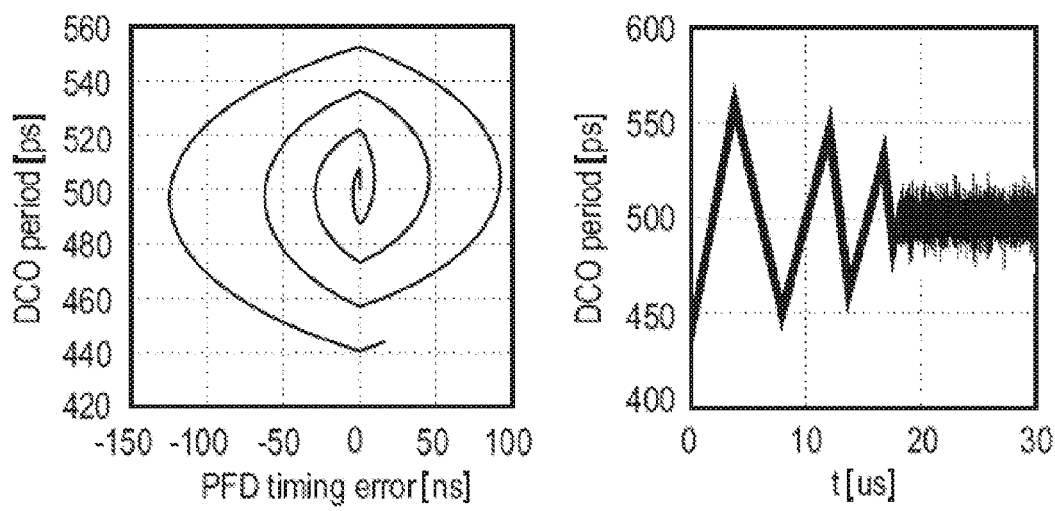
PRIOR ART   Fig. 2

METHOD AND ARRANGEMENT FOR GENERATING A CLOCK SIGNAL BY MEANS OF A PHASE LOCKED LOOP

CROSS REFERENCE TO RELATED APPLICATIONS

This application claims priority of German application No. 10 2013 101 933.1 filed on Feb. 27, 2013, the entire contents of which is hereby incorporated by reference herein.

BACKGROUND ART

The invention relates to a method for generating a clock signal by means of a phase locked loop, a divided clock signal generated from the clock signal being compared with a reference clock, and a frequency and a phase angle of the clock signal to be generated being set as a function of said comparison.

The invention also relates to an arrangement for generating a clock signal, composed of a phase locked loop comprising a digitally controlled oscillator for generating the clock signal, a frequency divider, a phase frequency detector, which has an input for a reference clock, and a digital filter.

Phase locked loops (PLLs) are widely used arrangements for generating clock signals in integrated circuits. To this end, these loops can be used as frequency multipliers, a high-frequency clock signal with a defined integral or rational multiple of the reference frequency being generated on the basis of a reference clock signal with a typically low frequency. Use is made, to this end, of a phase frequency detector (PFD) which compares the signal edges of the reference clock with the signal edges of the divided clock of the oscillator.

In a so-called locked-in state, the time difference of the signal edges at the PFD input is zero. In this case, the period length of the clock signal $T_{DCO}$ to be generated corresponds to the period length of a reference clock signal $T_{REF}$ divided by a divider factor N, owing to the inverse proportionality between frequency and period and to the frequency division of the oscillator signal upstream of the PFD input, it being the case that $T_{DCO} = T_{REF}/N$.

After the activation of the phase locked loop circuit, this state is produced by the regulation loop. The time required for this is termed the settling time. Frequency and phase of the output signal are not defined during this settling time. Consequently, the generated clock signal cannot be used for the functional operation of a module to be supplied with this clock. It is therefore necessary to strive to shorten said settling time. After the settling of the phase locked loop, the phase error at the PFD is zero and the oscillator settles at its target frequency.

The PLL is locked.

Separate procedures are known from the prior art for determining frequency and phase for phase locked loops. For example, counters can be used for frequency determination which determine the target frequency in combination with a search algorithm. Such a binary search is known, for example, from H. Eisenreich, C. Mayr, S. Henker, M. Wickert, and R. Schüffny, A novel ADPLL design using successive approximation frequency control, Microelectron. J., vol. 40, pp. 1613-1622, November 2009.

The publication C.-T. Wu, W.-C. Shen, W. Wang, and A.-Y. Wu, A two-cycle lockin time ADPLL design based on a frequency estimation algorithm, Circuits and Systems II: Express Briefs, IEEE Transactions on, vol. 57, no. 6, pp. 430-434, June 2010 presents a further method for this in the case of which the control characteristic of the digitally controlled oscillator is measured and the target frequency for the settling is determined. In this case, the phase angle upon starting of the oscillator is achieved by synchronizing the start signal with the reference clock.

After a so-called lockin according to a prescribed desired frequency with the aid of a frequency detector, the phase angle of the clock signal is adjusted following this step. If no additional phase synchronization is performed, this happens through the closed regulation loop of the phase locked loop. Owing to the loop filter, this requires a significant time, which is extended by the settling time of the PLL.

The phase synchronization proposed in C.-T. Wu, W.-C. Shen, W. Wang, and A.-Y. Wu, A two-cycle lockin time ADPLL design based on a frequency estimation algorithm, Circuits and Systems II: Express Briefs, IEEE Transactions on, vol. 57, no. 6, pp. 430-434, June 2010 requires a special complicated oscillator architecture. Moreover, an additional phase error can result between divided oscillator clock and reference clock owing to asynchronous frequency dividers and cannot be compensated by using this technique.

A further disadvantage of this prior art resides in the fact that it is necessary to use separate circuit blocks for frequency and phase detection, and this increases the outlay on hardware, and thus also the need for chip surface.

BRIEF SUMMARY OF THE INVENTION

The invention is therefore based on the object of specifying a method for generating a clock signal and an associated circuit arrangement by means of which the time for adjustment to a prescribed frequency and phase of a clock signal is reduced together with a reduction in the outlay on hardware required with this solution. Moreover, the outlay on the changes to an existing PLL architecture that are required by the invention is intended to be kept low.

In a method for generating a clock signal by means of a phase locked loop, it is therefore proposed that a plurality of selection signals respectively shifted by a time difference delta t are generated from the divided clock signal, that a comparison signal (capture) is generated under control by an edge of the reference clock and a comparison is started in the case of which what is selected is that selection signal shifted by delta t which exhibits with its edge the least possible time deviation from the edge of the comparison signal, and that said selected selection signal is output.

The clock signals $T_{DCO}*N$, customary in the prior art for comparison in the phase frequency detector, generated by a frequency divider, and $T_{REF}$, generated by means of a reference generator, for example, are input signals of the inventive method. A plurality of selection signals are generated from the clock signal $T_{DCO}*N$, said selection signals always being shifted relative to one another by a time difference delta t. One of these selection signals represents the optimum signal with which the downstream phase frequency detector is driven in such a way that the phase locked loop operates immediately at the correct phase angle and is therefore latched. The invention implements the selection and output of the appropriate selection signal. To this end, under the control of an edge of the divided clock signal $T_{DCO}*N$ a signal edge (capture) is generated and compared with the edges of the selection signals. The selection signal which agrees with the signal edge (capture), or exhibits the least deviation, is output.

In a refinement of the invention, it is provided that data representing the selected selection signal are stored in a memory and are read out from said memory when the method is restarted.

The method offers the possibility of storing the selected selection signal or data representing said selection signal. This storage offers the advantage that given a known frequency after a PLL has been turned on or restarted, the previously described selection for an optimum selection signal need no longer take place, and that instead it is possible to access the stored data of the selection signal. The settling process of the PLL is shortened by this possibility.

It is therefore proposed in the case of an arrangement for generating a clock signal by means of a phase locked loop that arranged in the phase locked loop between the output of the frequency divider and inputs of the phase frequency detector is a phase synchronization arrangement which has an input for a reference clock and whose outputs are connected to the inputs of the phase frequency detector.

In an inventive phase locked loop, the input signals of the phase frequency detector are generated by means of a phase synchronization arrangement upstream thereof. The phase synchronization arrangement generates the input signals of the phase frequency detector in such a way that the frequency and phase angle of the phase locked loop achieve their desired values without the settling process customary in the prior art.

The inventive phase synchronization is used in this case for frequency detection during starting of the PLL. The output signal of the PFD after the synchronization indicates whether $T_{DCO}*N>T_{REF}$ or $T_{DCO}*N<T_{REF}$. On this basis a search algorithm can be run to find the correct target frequency.

This results in a substantial advantage over the prior art, which resides in the fact that there is no need for frequency counters with complicated hardware. The phase synchronization in accordance with the invention ensures that a frequency difference between the two signals can be detected as early as after one clock pulse. (See FIG. 7)

Once the frequency search has been performed as described above, the phase synchronization arrangement ensures that the PLL is started at the point of zero phase difference at the PFD input.

In a particular embodiment of the invention, it is provided that the phase synchronization arrangement has a reference delay element which has an input for a reference clock and whose output is connected to an input of a downstream signal generator, that an output of the signal generator is connected to a control input of a downstream edge detector and to a first output of the phase synchronization arrangement (REF_SYNC), that the phase synchronization arrangement includes a delay chain which has an input for a divided clock signal and a plurality of taps on the output side, that the taps are connected to inputs of the edge detector, and that the edge detector has an output for outputting a signal selected by the detector and which is connected to the output (DIV_SYNC) of the phase synchronization arrangement.

In a delay chain, a plurality of selection signals which are respectively delayed by a time difference delta t are provided at the taps of the delay chain from the divided clock signal, present on the input side, of the digital oscillator $T_{DCO}*N$.

A signal edge of a control signal (capture) which is output at the output of the arrangement and, as input signal of the edge detector, starts the edge detection is generated from the second input signal $T_{REF}$ by means of a delay element and a signal generator. What is selected during this detection is that selection signal which represents the best edge agreement between the reference clock $T_{REF}$ and the divided oscillator clock $T_{DCO}*N$.

Furthermore, it is provided to use the inventive arrangement for setting the oscillator frequency, a matching of the edges of a first (REF_SYNC) and a second clock signal (DIV_SYNC) is produced. Said clock signals correspond to the clock signals of the reference clock and of the divided oscillator clock. Furthermore, the positions of the subsequent edges of the first and the second clock signal relative to one another are determined and as a function of this shift of the edges relative to one another a frequency difference is determined between the two clock signals which is used to correct the frequency of the digitally controlled oscillator.

It is therefore possible in a single subsequent clock pulse to use the edge comparison to conclude whether the divided oscillator frequency is greater or less than the reference clock frequency. Said determined frequency position is used to correct the frequency of the oscillator.

BRIEF DESCRIPTION OF THE DRAWING FIGURES

Figure 4:
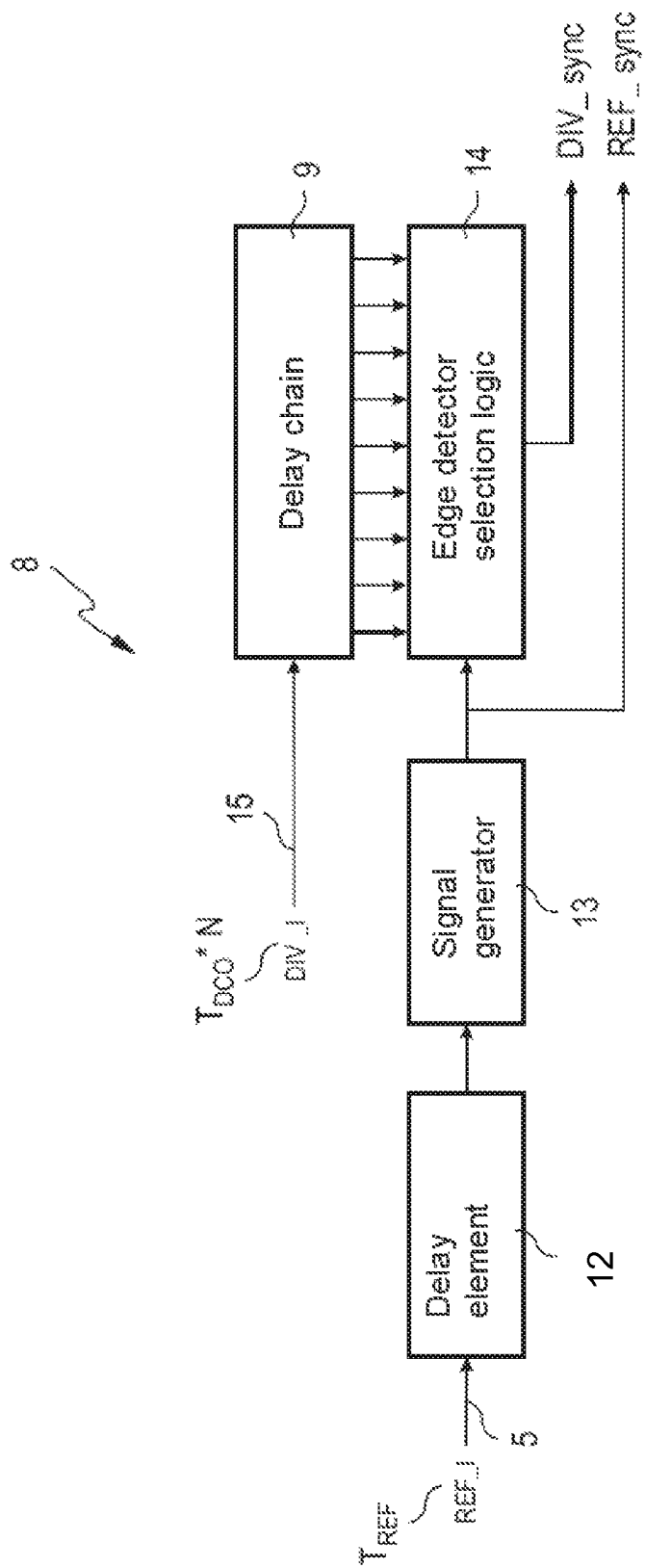
Figure 5:
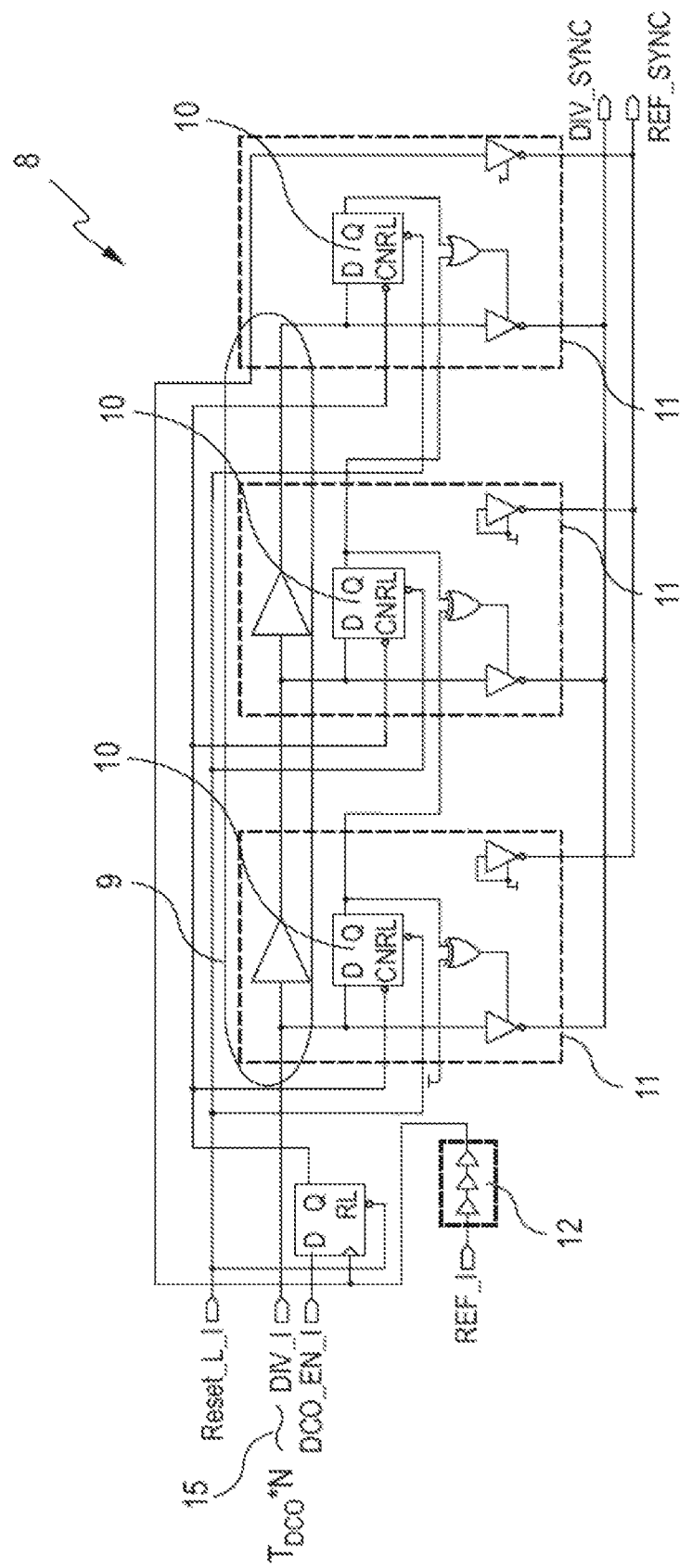
Figure 6:
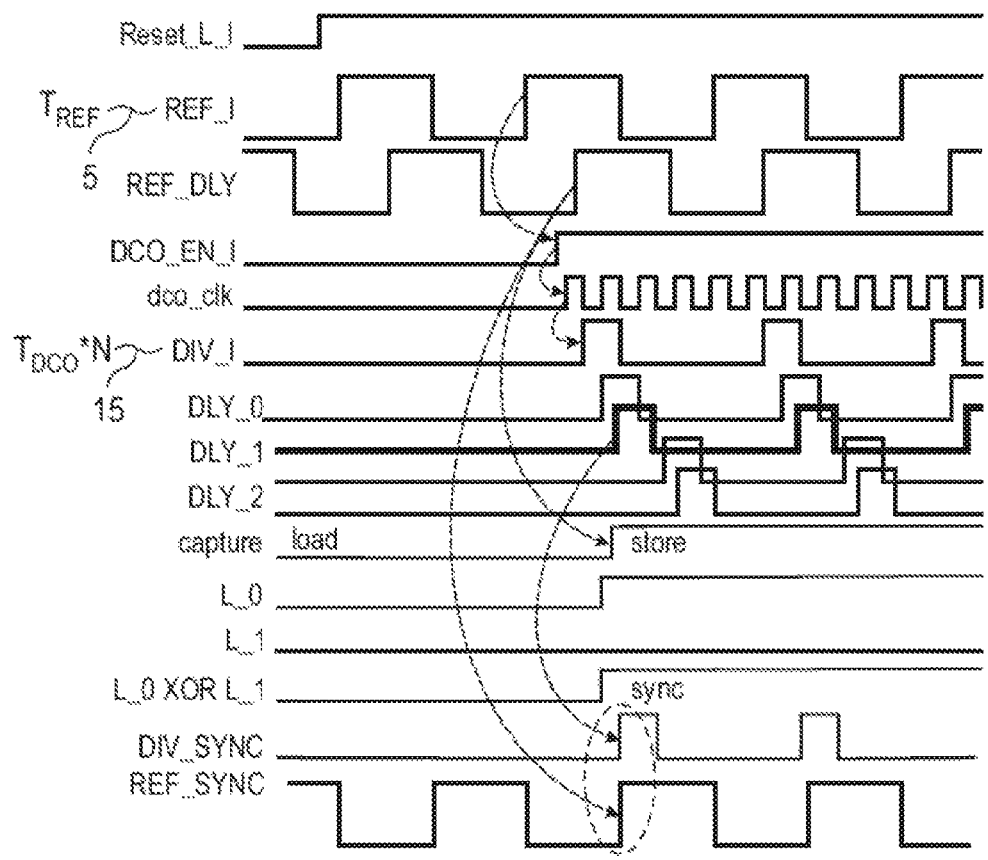
Figure 7:
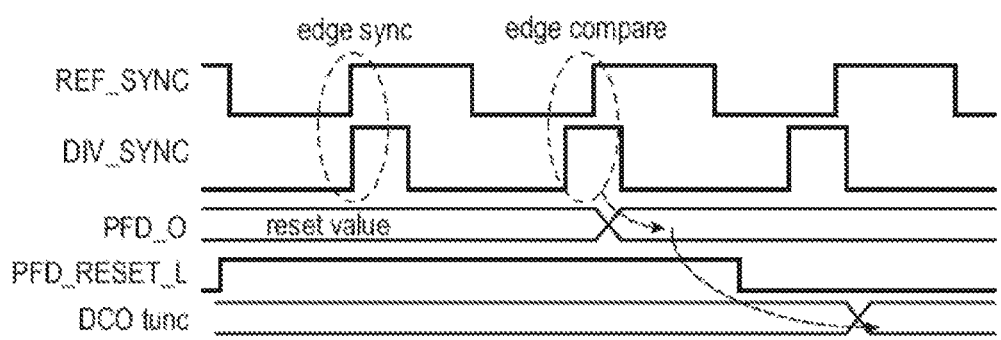
Figure 8:
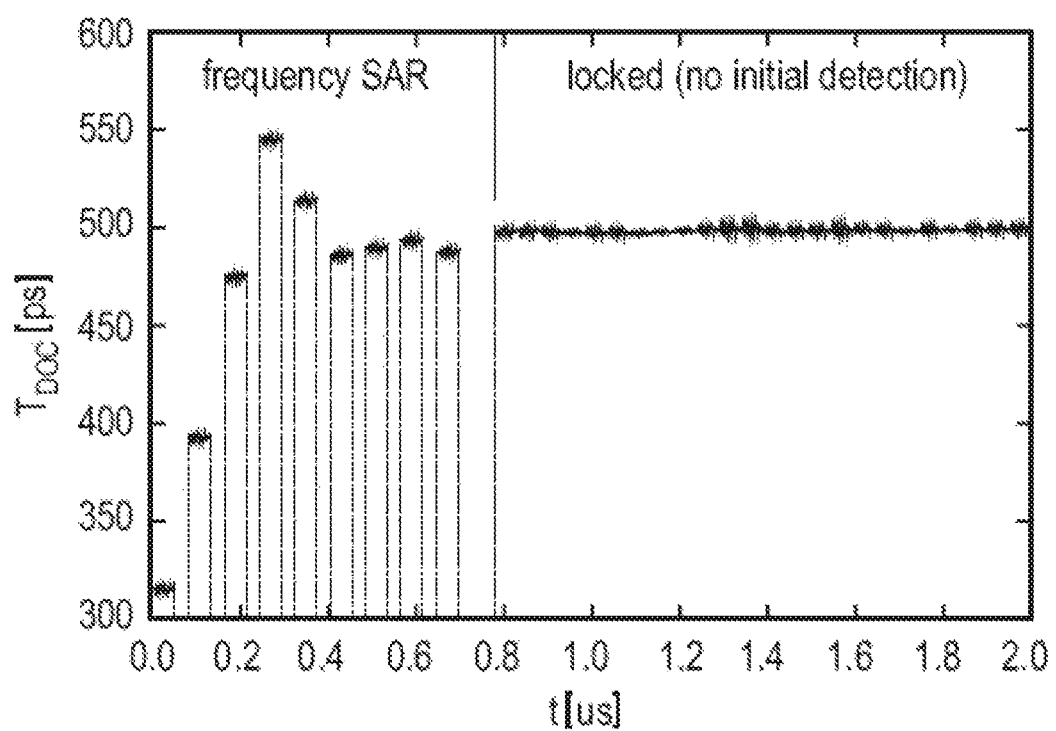
Figure 9:
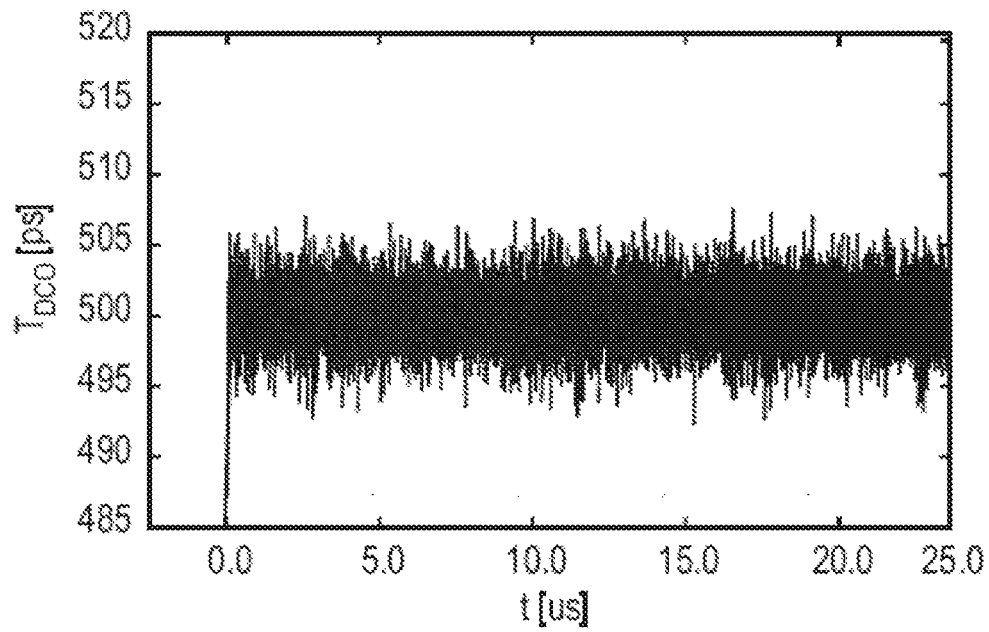
Figure 10:
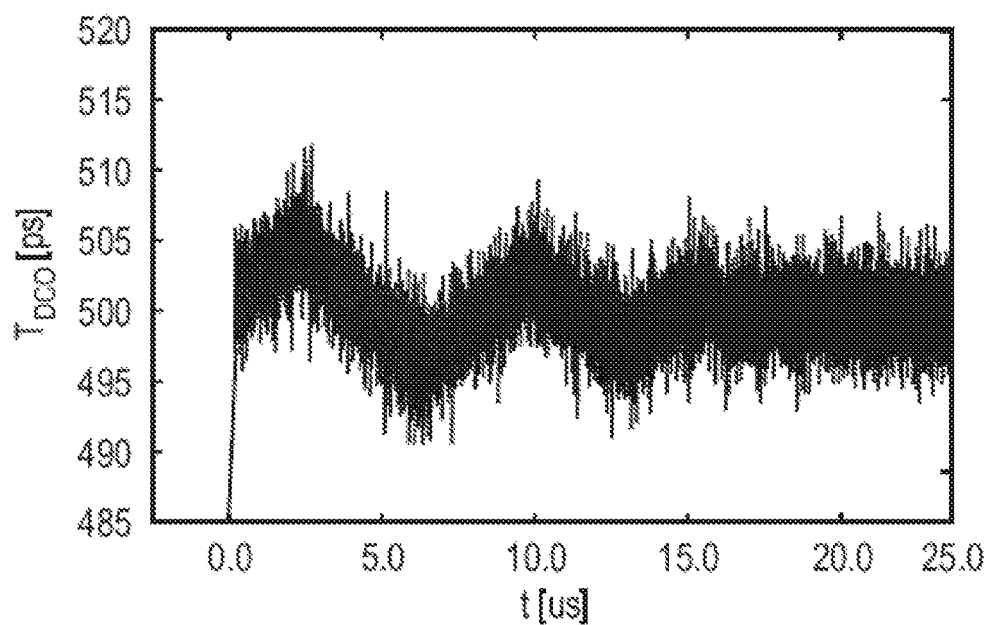

The invention is to be explained in more detail below with the aid of an exemplary embodiment. In the associated drawings FIG. 1 shows an arrangement for generating a clock signal by means of a phase locked loop (PLL) from the prior art, FIG. 2 shows an illustration of the trajectory of the DCO oscillation frequency and of the phase error at the input during a settling process of a phase locked loop from the prior art, FIG. 3 shows an arrangement for generating a clock signal having an inventive phase synchronization arrangement, FIG. 4 shows an illustration of the principle of the inventive phase synchronization arrangement, FIG. 5 shows an inventive embodiment of the phase synchronization arrangement with a three-stage delay chain, FIG. 6 shows a graphic illustration of the signal profiles at and in the inventive phase synchronization arrangement, FIG. 7 shows a graphic illustration of the signal profiles for binary frequency determination, FIG. 8 shows a graphic illustration of the period length profiles measured in an exemplary embodiment during the settling of frequency and phase on the example of a test chip in 28 nm CMOS technology, FIG. 9 shows a graphic illustration of a measured period length profile upon reconnection of the phase locked loop when the invention is being used, and FIG. 10 shows a graphic illustration of the measured period length profiles upon reconnection of the phase locked loop without use of the invention.

DETAILED DESCRIPTION

A phase locked loop (PLL) 1 such as is known from the prior art is illustrated in FIG. 1. A digitally controlled oscillator (DCO) 2 generates a clock signal $T_{DCO}$ 3, which is provided at the output of the phase locked loop 1. Said clock signal 3 is divided by means of a frequency divider 4 via a second output of the oscillator 2 in a prescribed ratio $T_{DCO}*N$ and applied to a first input of a phase frequency detector 6. Said down-divided clock signal is compared in the phase frequency detector 6 with a reference clock $T_{REF}$ 5 applied at the second input. In the case of inequality, there is output at the output of the phase frequency detector 6 a control signal which passes via a digital filter 7 to the control input of the oscillator 2 and controls the latter in such a way that the prescribed frequency for the clock signal is set.

In the left-hand diagram, FIG. 2 illustrates by way of example a trajectory of an oscillation frequency of the digitally controlled oscillator 2 and of the associated phase error at the input of the phase frequency detector 6 during a settling process of a conventional ADPLL, while in the right-hand diagram is illustrated a time profile of the period length of the digitally controlled oscillator 2.

An arrangement for implementing the inventive method is illustrated in FIG. 3. In the phase locked loop 3 known from the prior art and illustrated in FIG. 1, there is inserted between the output of the frequency divider 4 and the inputs of the phase frequency detector 6 a phase synchronization arrangement 8 to which the reference clock 5 is applied. By using a phase synchronization arrangement 8 directly upstream of the phase frequency detector 6 of the phase locked loop 1, immediately after switch-on phase error between the reference clock $T_{REF}$ 5 and the divided oscillator clock $T_{DCO}$*N can be compensated to zero. The phase is thereby directly locked and the settle time is shortened.

FIG. 4 shows a possible implementation of the phase synchronization arrangement 8 from FIG. 3. On the input side, this arrangement is provided with the divided clock signals $T_{DCO}$*N, known from FIGS. 1 and 3, at the input of a delay chain 9 and $T_{REF}$ 5 at the input of an additional delay element. It is ensured by means of said additional delay element that the optimum tap of the delay chain 9, in the case of which the output signals of the phase synchronizer REF_SYNC and DIV_SYNC are to have a phase error close to zero, are ideally located in the middle of the delay chain 9, in order to gain the greatest possible latitude for compensation with reference to manufacturing tolerances in the semiconductor process. Since the divided clock signal TDCO*N must typically run through a frequency divider, it is pre-delayed relative to the reference clock. Said pre-delay can be achieved in addition by a delay element 12 (reference delay line in FIG. 5).

The delay elements illustrated with the reference numeral 11 in FIG. 5 serve to compensate the delay time within the selection circuit by the latch and the XOR gate.

Under the control of the pre-delayed reference clock $T_{REF}$ 5, the downstream signal generator generates a signal edge for driving the edge detector, said signal simultaneously being output to the phase frequency detector 6. Said signal denoted in FIG. 4 by REF_SYC represents one of the two input signals of the downstream phase frequency detector 6.

The edge detector implements the inventive selection of those adjacent taps of the delay line in the case of which the delayed divided clock signals DLY_x (where x=1, 2, 3 up to the number of the elements or taps of the delay chain 9 has a signal edge at the instant of the edge of the capture signal generated by the signal generator. By means of a selection logic of the edge detector, that delayed clock signal is selected which represents the best agreement between the rising edges of the reference clock $T_{REF}$ and the frequency-divided oscillator clock $T_{DCO}$*N, and is output at the output. Said output signal is denoted in FIG. 4 by "REF_SYNC", and represents the second input signal of the downstream phase frequency detector 6.

The processes running in the phase synchronization arrangement 8 are to be described by way of example below. Reference is made to the signal profiles and designations shown in FIG. 6 for the purpose of better understanding.

At the beginning of the settling process, the circuit is in the reset state. The RESET_L_I signal has a low level.

The oscillator of the PLL is activated for the purpose of fast settling. The signal DCO_EN_I goes from a low level to a high level, whereupon a first rising clock edge occurs at the frequency divider output. Said clock edge is illustrated with the signal DIV_I.

Said clock edge is intended to be synchronized with a rising clock edge of the delayed reference clock (REF_DLY), which occurs after activation of the oscillator. This is performed by the invention.

The inventive cycle comprises the following substeps which refer to FIGS. 4 and 6:

The reference clock is pre-delayed by a delay element 12.

The frequency divider clock $T_{DCO}$*N is passed through a delay line which has a plurality of taps.

A signal generator generates a single signal edge (capture signal) by means of which the arrangement for edge detection is activated.

An edge detector detects those adjacent taps of the delay line in the case of which the delayed divider clock (DLY_0, DLY_1, . . . DLY_x) has a signal edge which agrees as best as possible with the edge of the capture signal.

The stored data of adjacent latches is compared by a selection logic, for example, an XOR gate. Said selection logic controls the multiplexer (for example, a tristate inverter), which then switches one of the taps to the output.

A phase synchronicity has thereby been produced between the reference clock $T_{REF}$ and divided clock $T_{DCO}$*N.

The selection logic steadily operates the phase locked loop, and therefore stores its selection value which has been determined with the edge of the capture signal.

The selection circuit and the signal generator can be put into a defined initial state via a reset signal (RESET_L_I).

FIG. 5 shows the circuit diagram of a possible implementation of the phase synchronization arrangement 8. A clock $T_{DCO}$*N divided in a frequency divider 4 runs through a delay chain where a plurality of state-controlled flipflops 10 (latches) are connected.

Only 3 such arrangements 10 are illustrated by way of example in FIG. 5. A part of the delay chain 5 with a respectively associated flipflop 10 and an associated logic circuit forms an element 11 boxed in by a broken dashed line.

The dotted lines between the second and last element 11 are intended to represent the possibility of extending the phase synchronization arrangement 8 by as many elements 11 as desired.

The state-controlled flipflops 10 are switched to opaque by the rising clock edge of the divided reference clock $T_{DCO}$*N, thus determining that point in the delay chain 9 where the rising edges of reference clock $T_{REF}$ and those of the frequency-divided oscillator clock $T_{DCO}$*N agree in their time profile and therefore have the same position in the diagram in FIG. 6. This tap of the delay chain 9 is used in the subsequent operation.

An exemplary implementation of the invention as shown in FIG. 5 is described below:

The delay chain 9 is implemented by buffers.

The capture signal is generated by an edge-triggered flip-flop with reset input.

Located at the output of each element 11 of the delay chain 9 are latches 10, which are switched from the load state to the hold state with the rising edge of the capture signal, and thereby the position.

The position of the divider clock edge within the delay line is implemented by paired exclusive OR combination of the data outputs of the latches 10.

A tristate multiplexer, which is controlled by the output of the exclusive OR gate, switches the divider clock signal to the output of the synchronizer (DIV_SYNC).

The reference clock is passed through a tristate multiplexer of the same design which, however, has a fixed selection signal. This serves to ensure the signal symmetry.

Possible variations of the embodiment are:
- interchange of reference clock and divider clock in the arrangements in accordance with FIG. 4 and FIG. 5.
- use of combinatorial multiplexers instead of the tristate multiplexers
- use of flipflops instead of latches in the edge detector circuit.

An associated signal profile of the phase synchronization arrangement 8 is illustrated in FIG. 6. The clock signal of that state-controlled flipflop 10 which has the above-described agreement is illustrated with the aid of a bold line. Said clock signal is designated in FIG. 6 by DLY_1.

The method can be used, moreover, to determine frequency. FIG. 7 shows the corresponding signal profiles. The signals denoted by REF_SYNC and DIV_SYNC are the two output signals of the phase synchronization arrangement 8, which represent the input signals of the downstream phase frequency detector 6.

The position of the subsequent edges relative to one another is a measure of the frequency difference of the two signals once the clock edges of the divided oscillator clock $T_{DCO}*N$ and the reference clock $T_{REF}$ 5 are synchronized, which also corresponds to an edge agreement between the two output signals REF_SYNC and DIV_SYNC.

The synchronization of the two edges is marked in FIG. 7 with a first dashed circle and the legend "edge sync". The relative positions of the subsequent edges are marked with a second dashed circle and the legend "edge compare".

The sign of this frequency difference, that is to say the direction of the shifting of the two edges relative to one another, can be determined with the binary phase detector, there being required only very few clock cycles here in comparison with counter-based solutions. It is possible on the basis of this frequency comparison to make use of search algorithms according to the prior art (for example successive approximation) in order to lock in the frequency.

When the PLL is operated with a closed regulation loop, the setting of the phase synchronization arrangement 8 is unchanged, that is to say having once been selected the tap of the delay chain 9 continues to be used in ongoing operation, and so it is possible to regulate to a zero phase error without interference.

Once the phase locked loop is deactivated during operation of the system, the control value of the oscillator, which corresponds to its frequency, can be stored if the PLL has been implemented digitally. Upon reconnection, it is then possible to dispense with determining the target frequency, in which case the phase synchronization arrangement 8 enables settling immediately.

FIGS. 8 and 9 show the measured period length profiles on a test chip implementation of the invention within 28 nm CMOS technology. It is to be seen that the regulation loop 1 is immediately locked at a previously known frequency after the frequency search or after the phase locked loop 1 is turned on again. The invention thus enables a reduction in the time for settling at a prescribed frequency and phase of a clock signal.

FIG. 10 shows a measured period length profile in the event of the phase locked loop being turned on again with a known control value of the oscillator, but without using the invention, by contrast with FIG. 9. The phase locked loop changes the frequency of the oscillator by the phase difference at the input of the phase frequency detector 6 to zero by way of compensation.

The invention claimed is:

1. A method for generating a clock signal by a phase locked loop, in which a divided clock signal generated from the clock signal is compared with a reference clock, and a frequency and a phase angle of the clock signal to be generated is set as a function of said comparison, comprising: generating a plurality of delayed divided clock signals respectively shifted by a time difference delta t from the divided clock signal, generating a capture signal under control by an edge of the reference clock, and starting a comparison, activated by the capture signal, between the capture signal and said plurality of delayed divided clock signals to select a delayed divided clock signal having an edge which exhibits a least possible time deviation from an edge of the capture signal, and outputting said capture signal and said delayed divided clock signal to a phase frequency detector of the phase locked loop.

2. The method as claimed in claim 1, wherein the capture signal is generated by passing the reference clock through a delay element, the capture signal comprises a signal edge for driving the comparison, and data representing the selected delayed divided clock signal is stored in a memory and is read out from said memory when the method is restarted.

3. An arrangement for generating a clock signal, composed of a phase locked loop comprising a digitally controlled oscillator for generating the clock signal, a frequency divider, a phase frequency detector, which has an input for a reference clock, and a digital filter, wherein arranged in the phase locked loop between an output of the frequency divider and inputs of the phase frequency detector is a phase synchronization arrangement having an input for the reference clock and outputs connected to inputs of the phase frequency detector, wherein the phase synchronization arrangement has a reference delay element having an input for the reference clock and an output connected to an input of a downstream signal generator, wherein a capture signal outputted from the signal generator is connected to a control input of a downstream edge detector and to a first output of the phase synchronization arrangement, wherein the phase synchronization arrangement includes a delay chain having an input for a divided clock signal and a plurality of taps on an output side, wherein the taps are connected to inputs of the edge detector, and wherein the edge detector has an output for outputting a delayed divided clock signal selected by the detector and which is connected to a second output of the phase synchronization arrangement.

4. A method of using the arrangement for generating a clock signal as claimed in claim 3 to regulate a frequency of the digitally controlled oscillator for generating the clock signal, comprising: producing, with the edge detector, a matching of edges of the capture signal and the delayed divided clock signal for phase synchronization, determining positions of subsequent edges of the capture signal and the delayed divided clock signal relative to one another, and determining, as a function of a shift of the subsequent edges relative to one another, a frequency difference between the capture signal and the delayed divided clock signal which is used to correct the frequency of the digitally controlled oscillator.

* * * * *